United States Patent [19]

Mayes et al.

[11] Patent Number: 5,465,092
[45] Date of Patent: Nov. 7, 1995

[54] PIPELINED ANALOG-TO-DIGITAL CONVERTER WITH CURVEFIT DIGITAL CORRECTION

[75] Inventors: Michael K. Mayes, San Jose; Sing W. Chin, Alameda, both of Calif.

[73] Assignee: National Semiconductor Corporation, Santa Clara, Calif.

[21] Appl. No.: 183,679

[22] Filed: Jan. 19, 1994

[51] Int. Cl.$^6$ ........................................................ H03M 1/06
[52] U.S. Cl. ............................................ 341/118; 341/155
[58] Field of Search ................................... 341/118, 120, 341/143, 155, 166

[56] References Cited

U.S. PATENT DOCUMENTS

| | | |
|---|---|---|
| 4,931,797 | 6/1990 | Kagawa et al. . |
| 5,047,772 | 9/1991 | Ribner ................................ 341/156 |
| 5,257,026 | 10/1993 | Thompson et al. ................ 341/118 |
| 5,266,952 | 11/1993 | Stone et al. . |

FOREIGN PATENT DOCUMENTS

| | | |
|---|---|---|
| 2265775 | 10/1993 | United Kingdom . |
| 8911757 | 11/1989 | WIPO . |

*Primary Examiner*—Brain K. Young
*Attorney, Agent, or Firm*—S. Caserza; Flehr Hohbach Test Albritton & Herbert

[57] ABSTRACT

An ADC system in which raw ADC data is received and digitally manipulated to increase the accuracy of the resultant digital output word. In one embodiment, the digital manipulation of this invention is performed on data which has been preliminarily adjusted for errors caused by use of an interstage gain less than ideal. In one embodiment, digital correction is performed based only on the errors of a plurality of most significant bit stages, rather than all stages, as the effect on error of the digital output word is of decreasing importance for stages of less significance. In accordance with one embodiment of this invention, offset error and full scale error are determined by applying ±Vref as an input signal to the ADC. These values allow the raw digital data from the ADC to be compensated in either hardware or software to provide a more accurate digital representation of the analog input voltage being measured. In accordance with another embodiment of this invention, second order errors are removed by determining the magnitude of, for example, capacitor value voltage coefficients of the MSB stage of the ADC after calibration of lesser significant bit stages, and using these voltage coefficients to further adjust the digital output word, providing an even more accurate digital representation of the analog input signal being measured.

32 Claims, 9 Drawing Sheets

$$Vres = 2(Vin + \frac{Vref}{2})  \quad  Vres = 2(Vin - \frac{Vref}{2})$$

PIPELINED ANALOG-TO-DIGITAL CONVERTER WITH CURVEFIT DIGITAL CORRECTION

BACKGROUND OF THE INVENTION

This invention pertains to analog-to-digital converters, and more specifically to pipelined analog-to-digital converters which, in accordance with the teachings of this invention, utilize digital correction features.

DESCRIPTION OF PRIOR ART

The typical N-bit pipelined analog-to-digital converter (ADC) consists of N 1-bit stages which, as shown in FIG. 1, each include a comparator 11, summing element 12, and gain element 13.

The analog input signal Vin to stage 10 is multiplied by 2 by gain element 13. A reference voltage Vref is either added to or subtracted from 2*Vin by summing element 12, depending upon the digital input signal Din to stage 10. The resultant residual voltage $$Vres = 2Vin \pm Vref \tag{1}$$

is applied the next stage. The polarity of residual voltage Vres is detected by comparator 11, whose output signal Dout serves as the digital input signal Din of the next stage. Cascading N similar stages 10-1 through 10-N results in an N-bit Analog-to-Digital converter, as shown in FIG. 2, where the residual voltages of each stage are defined by equations (2), (3) and (4). Also shown in FIG. 2 is a "zeroth" stage 10-0, providing an N+1 bit ADC, which is the sign of the input voltage Vin. In the example of FIG. 2, stage 10-0 includes a one-times multiplier (for example, just a wired connection), and a comparator. The residual voltages for subsequent stages are based on the preceding stages:

$$Vres_1 = 2 \left( Vin \pm \frac{Vref}{2} \right) \tag{2}$$

$$Vres_2 = 2 \left( Vres_1 \pm \frac{Vref}{2} \right) \tag{3}$$

$$Vres_N = 2 \left( Vres_{N-1} \pm \frac{Vref}{2} \right) \tag{4}$$

Ideally, the transfer function of each stage is given by Equation 1 (for an input voltage of Vin), and is shown in graphical form in FIG. 3, having two segments defined by equations (5) and (6).

$$Vres = 2 \left( Vin + \frac{Vref}{2} \right) \tag{5}$$

$$Vres = 2 \left( Vin - \frac{Vref}{2} \right) \tag{6}$$

However, capacitor mismatch errors, charge injection, operational amplifier offset voltages, parasitic capacitance, and finite operational amplifier gain result in variations in the single stage transfer function, as graphically depicted in FIGS. 4a–4d with a solid line, as differentiated from the ideal transfer function shown as the shaded line. FIG. 4a shows the ideal transfer function and the actual transfer function for a stage in which the gain factor of gain element 13 (FIG. 1) is less than 2 as caused, for example, by capacitor mismatch; FIG. 4b shows the ideal and actual transfer functions for a stage in which the gain is greater than 2 as caused, for example, by capacitor mismatch; FIG. 4c shows the ideal and actual transfer function for a stage in which reference mismatch errors cause vertical shift; and FIG. 4d shows the ideal and actual transfer functions of a stage in which charge injection in the comparator feedback switch causes a comparator offset. Naturally, various ones of these transfer function errors are combined in an actual device.

The gain error of a pipelined stage is due to capacitor mismatches (typically 0.10% for double-layer polycrystalline silicon capacitors). As the ratio varies due to capacitor mismatch, the gain varies, as shown in FIGS. 4a and 4b. Gain element 13 includes an operational amplifier which inherently has finite gain and offset errors.

The residual voltage (Vres) is the combination of 2*Vin and +Vref. Variations in the capacitor matching lead to a vertical shift in the transfer function, as shown in FIG. 4c.

$$Vres = 2Vin \pm Vref + \alpha \tag{7}$$

where $\alpha$ is a constant error in reference voltage Vref.

Ideally, the digital input signal Din is given by $$Din = 0, \text{for } Vin < 0 \tag{8}$$

$$Din = 1, Vin > 0 \tag{9}$$

However, charge injection in comparator 11 causes a variation in the comparison point, resulting in a horizontal shift in the transfer function, as shown in FIG. 4d.

The combination of all these error mechanisms applied to a pipelined ADC limits the resolution of the ADC. Furthermore, redundancy must be added to the converter to account for overrange errors in which the transfer function exceeds ±Vref (see FIGS. 4b and 4c). This is done by using a gain less than 2 for each stage. Therefore, a 16-bit Pipelined ADC with 0.1% capacitor matching, 10 mV of charge injection, 10 mV of operational amplifier offset, a finite operational amplifier gain of 10,000, and an intra-stage gain of 1.97 results in a 1200 LSB linearity error, as depicted in FIG. 5. FIG. 5 is a graph having ADC code values (i.e., digital output words) on its X-axis, and the error, as measured in a multiple of the least significant bit value, displayed on its Y-axis. As shown in FIG. 5, for the criteria established for this example, a maximum error of approximately 1200 LSB is the undesirable result.

Charge injection, gain, and reference errors can be removed by using known techniques, such as self-calibration techniques, trimming capacitor values and reference values, and the use of dummy devices to minimize charge injection.

The majority of linearity errors is due to the use of a 1.97 gain factor rather than the ideal gain factor of 2. It is known to remove these errors by calculating three coefficients per stage, $K_0$, $K_1$, and $K_2$ (see FIG. 6), and applying them to the raw output data. Once these coefficients $K_0$, $K_1$ and $K_2$ are known for each stage, the linearity error can be corrected, as described in __1993 *IEEE International Solid-State Circuits Conference*, Session 4, Paper WP 4.2. FIG. 7 shows the progression of linearity correction starting with calibrating LSB stage 10–N (i.e. stage 10-16 for an ADC where N=16), and progressing towards the calibration of successively more significant bit stages to the most significant bit stage 10-1. The resulting linearity has a large fullscale and offset error.

Thus, even by utilizing known techniques for minimizing the effects of charge injection, gain errors, and reference voltage errors, as well as the more complex prior art technique of calculating three digital coefficients per stage for application to the raw, uncalibrated output data as correction factors, a significant error remains in analog-to-digital converters. Accordingly, there remains the need to provide further accuracy in analog-to-digital conversions.

SUMMARY

A novel analog to digital converter system is taught in which raw ADC data is received and digitally manipulated in one or more ways in order to increase the accuracy of the resultant digital output word representing the analog input voltage being measured. In one embodiment, the digital manipulation of this invention is performed on data which has been preliminarily adjusted for errors caused by use of an interstage gain less than ideal.

In one embodiment, digital correction is performed based only on the errors of a plurality of most significant bit stages, rather than all stages, as the effect on error of the digital output word is of decreasing importance for stages of less significance.

In accordance with one embodiment of this invention, offset error and full scale error are determined by applying ±Vref as an input signal to the ADC. These values allow the raw digital data from the ADC to be compensated in either hardware or software to provide a more accurate digital representation of the analog input voltage being measured.

In accordance with another embodiment of this invention, second order errors are removed by determining the magnitude of, for example, the error due to capacitor voltage coefficients of the MSB stage of the ADC after calibration of lesser significant bit stages, and using these voltage coefficients to further adjust the digital output word, providing an even more accurate digital representation of the analog input signal being measured.

DETAILED DESCRIPTION

Figure 1:
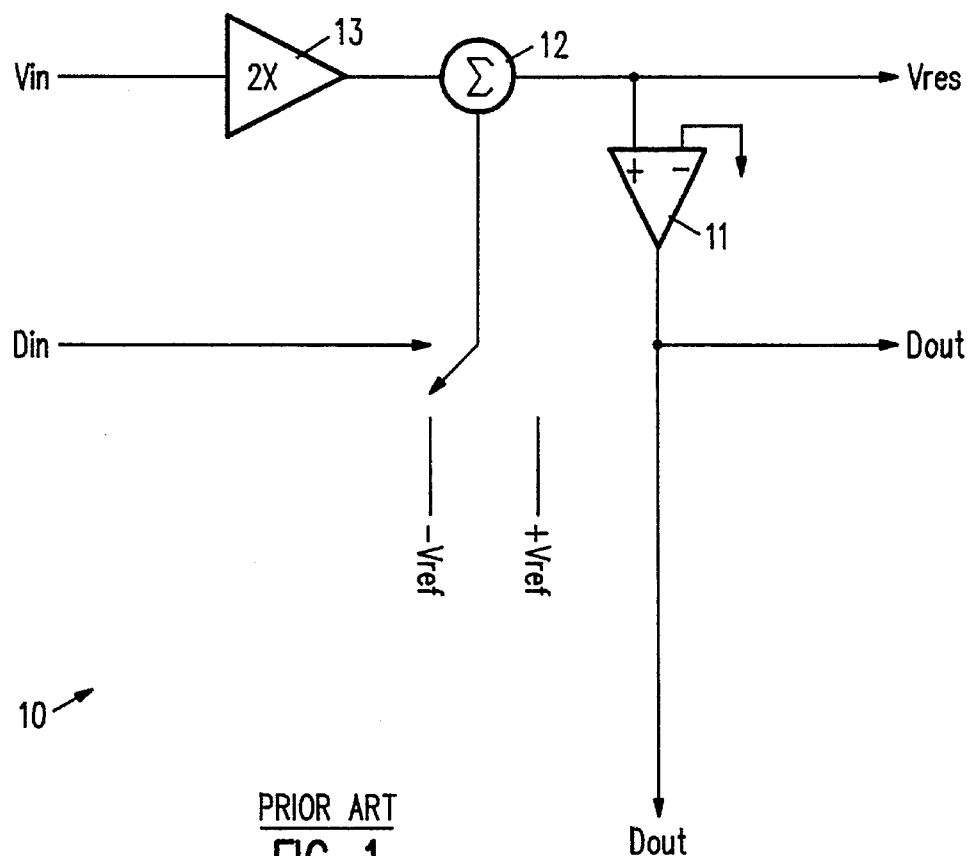
FIG. 1 is a diagram depicting a typical prior art 1-bit analog to digital converter stage.
Figure 3:
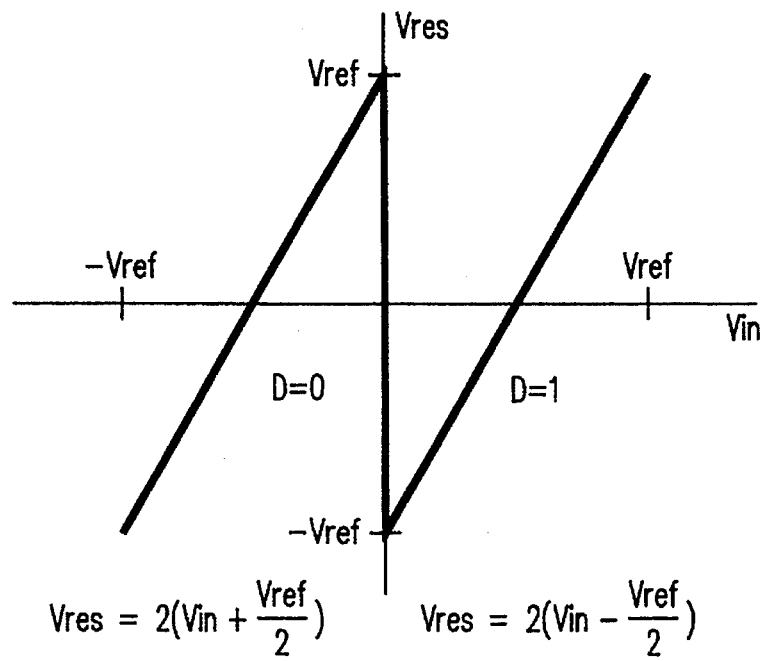
FIG. 3 is a graph of the transfer function of an ideal analog to digital converter stage of FIG. 1.
Figure 2:
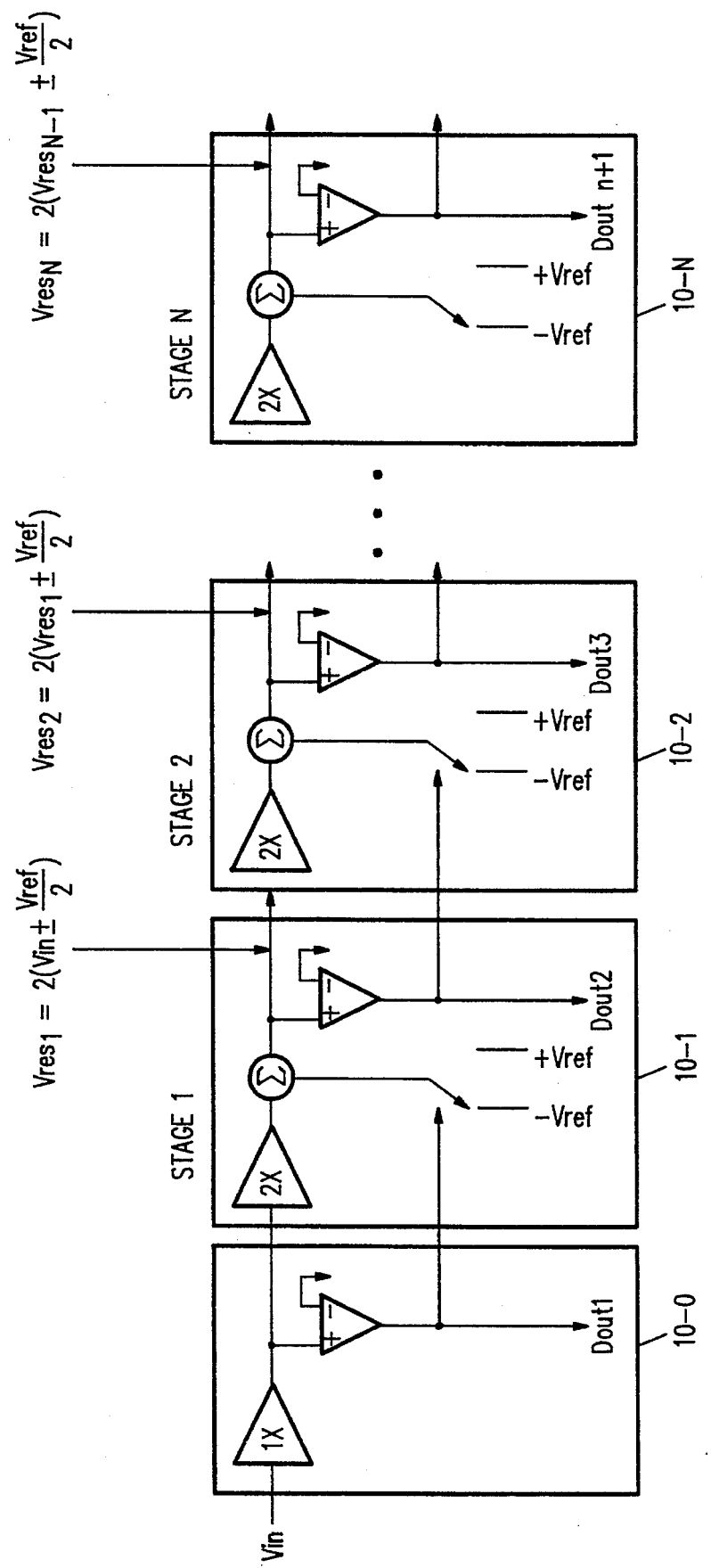
FIG. 2 is a diagram of a typical prior art N+1 bit analog to digital converter.
Figure 4A:
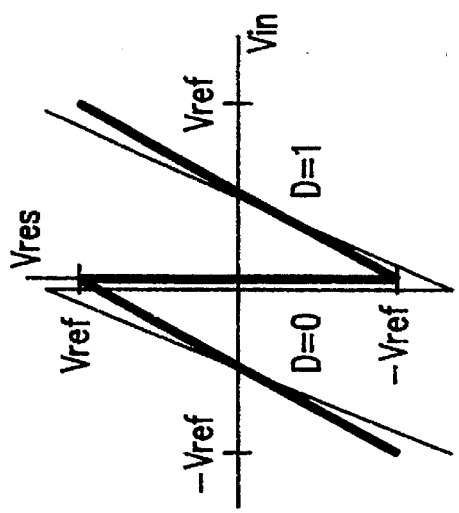
FIGS. 4a–4d are graphs depicting nonideal transfer functions due to various inaccuracies in implementing the analog to digital converter stage of FIG. 1.
Figure 4B:
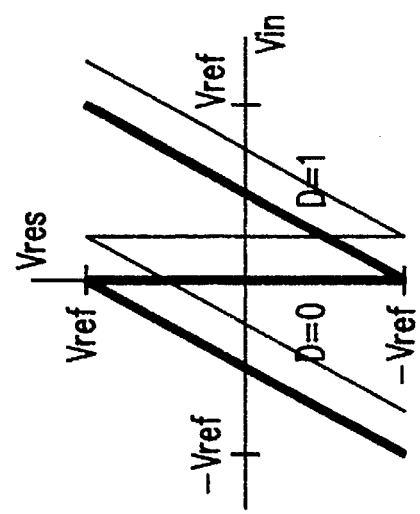
Figure 4C:
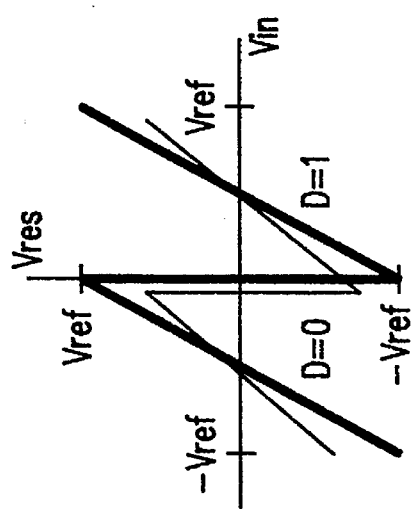
Figure 4D:
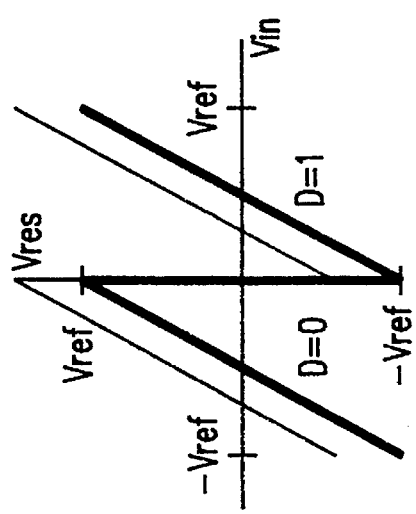
Figure 5:
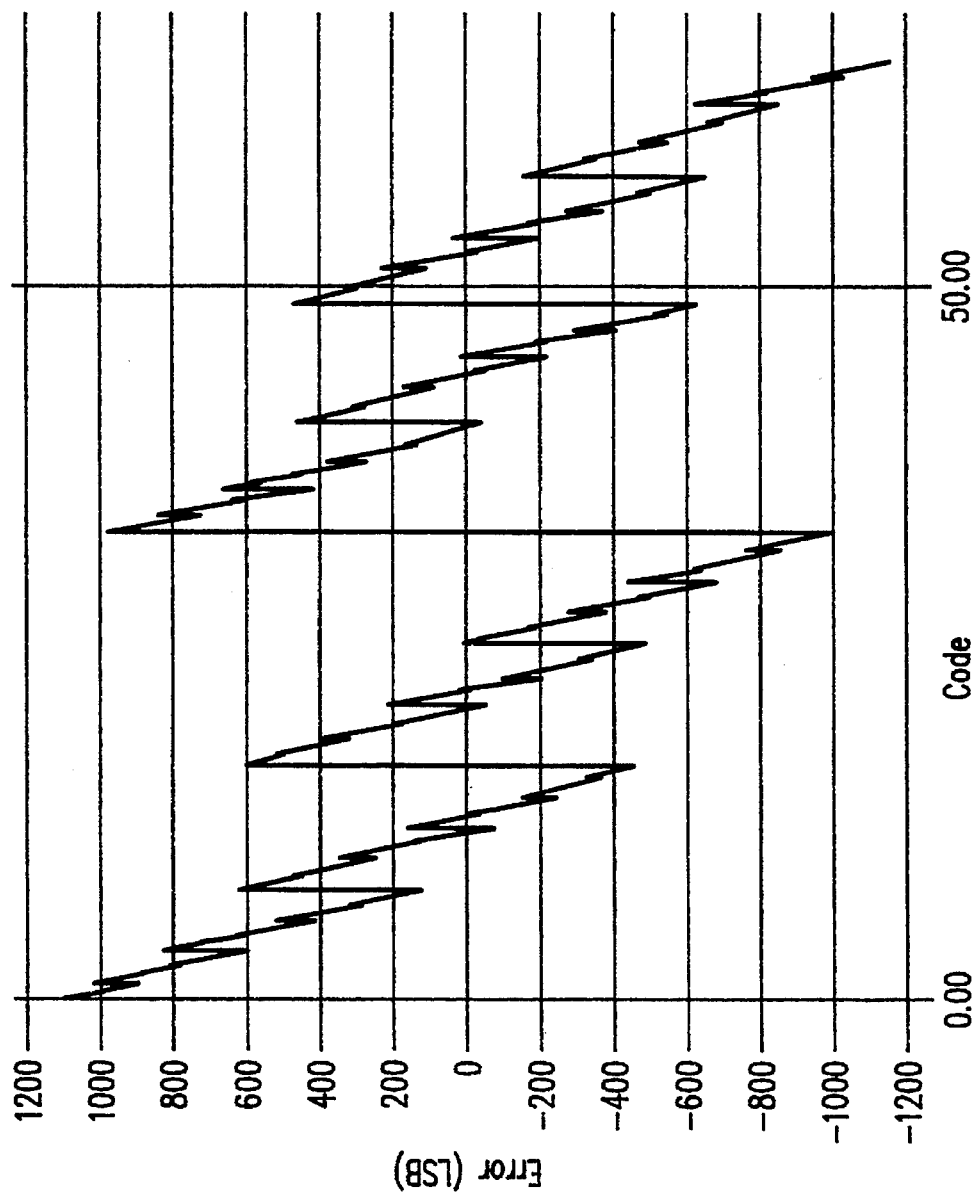
FIG. 5 is a graph depicting ADC code values verses error for a typical prior art analog to digital converter.
Figure 6:
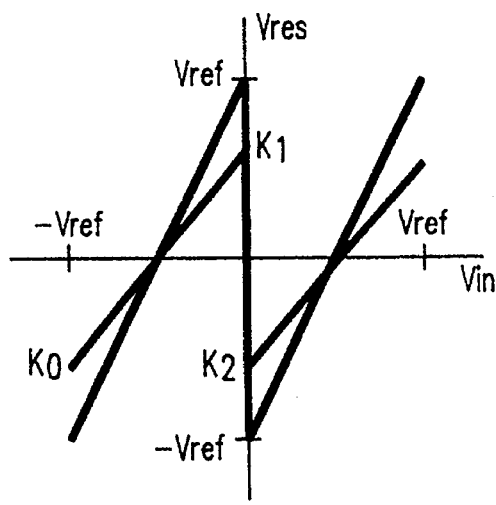
FIG. 6 is a graph of a transfer function for selected input voltages applied to an analog to digital converter to establish coefficients $K_0$, $K_1$, and $K_2$, in accordance with a prior art error correction technique.

One important characteristic of a pipelined ADC is the attenuation of error with respect to stage number. For example, the first (i.e. most significant bit) stage contributes 100% of its mismatches to the final linearity. However, the second stage is isolated from the input by a gain of 2, leading to a 50% contribution to the overall system errors. Similarly, the third stage errors are reduced to 25% and the forth to 12.5% and so on. Based on this feature of pipelined ADCs, in accordance with this exemplary embodiment of the present invention, curvefit calibration is only applied to the first four stages (i.e. the most significant stages 10-1 through 10-4 of the exemplary ADC circuit of FIG. 2), which results in an error of less than 1 LSB. Naturally, it will be appreciated by those of ordinary skill in the art in light of the teachings of this invention that the curvefit calibration taught by this invention can be applied to any number of stages in a pipelined ADC, depending on the desired amount of accuracy.

Figure 8B:
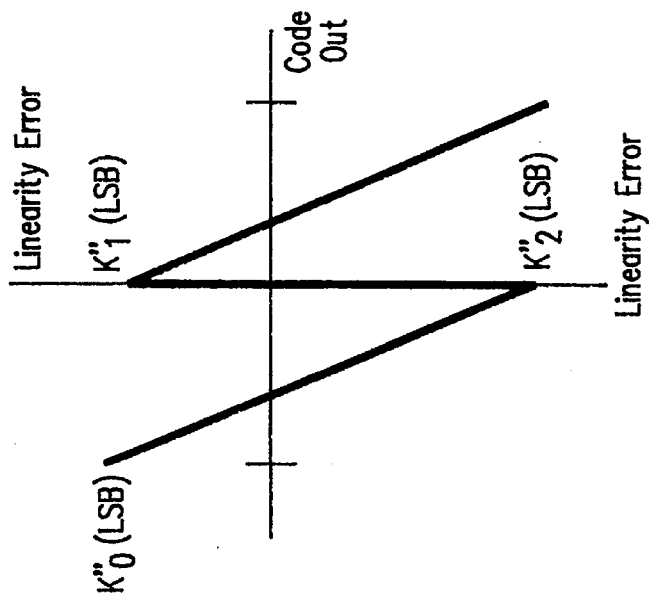
FIG. 8b depicts a transfer function of an analog to digital converter stage showing linerarity error.
Figure 8A:
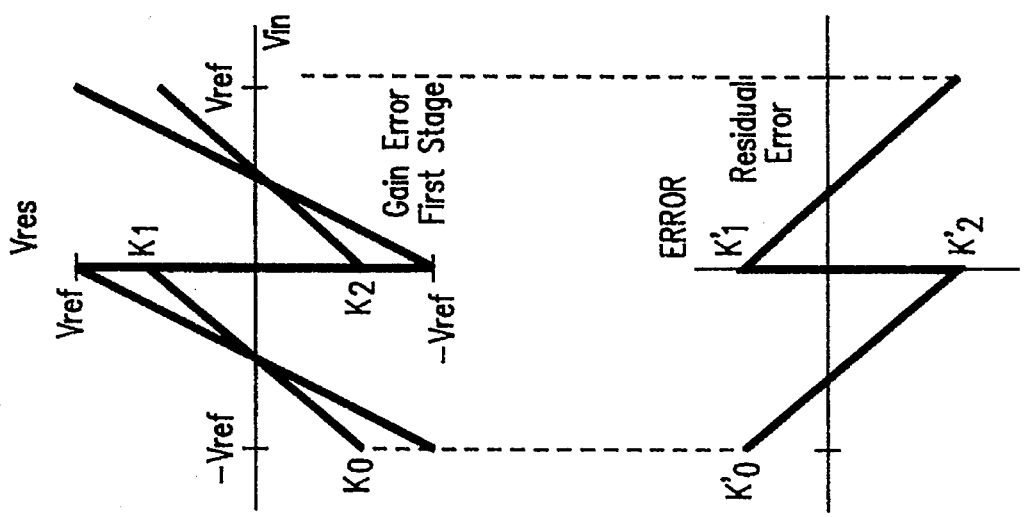
FIG. 8a depicts a transfer function of an analog to digital converter stage having gain error and residual voltage error.
Figure 12:
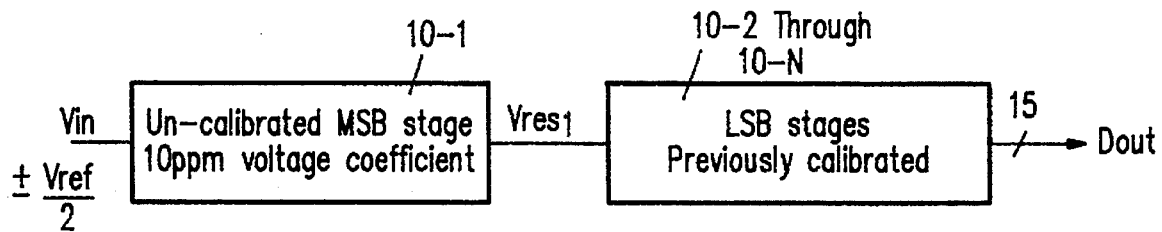
FIG. 12 is a block diagram depicting calibration of a first MSB stage, once subsequent LSB stages have been calibrated.

A second characteristic of a pipelined ADC is the inherent analog "multimeter" contained within the pipe. For the moment, consider a 16-bit ADC (having stages 10-0 through 10-16), in which stage 10-1 is non-ideal with a constant gain error and an associated residual voltage error as shown in FIG. 8a, while all remaining stages (stages 10-2 through 10-16) are ideal. A linearity sweep of an ADC under these conditions, as shown in FIG. 12 results in linearity errors whose signature matches the signature of the non-ideal stage 10-1, as depicted in the graph of FIG. 8b. This inherent feature of pipelined ADCs allows calibration of a given stage once stages for less significant bits have been calibrated.

Figure 7:
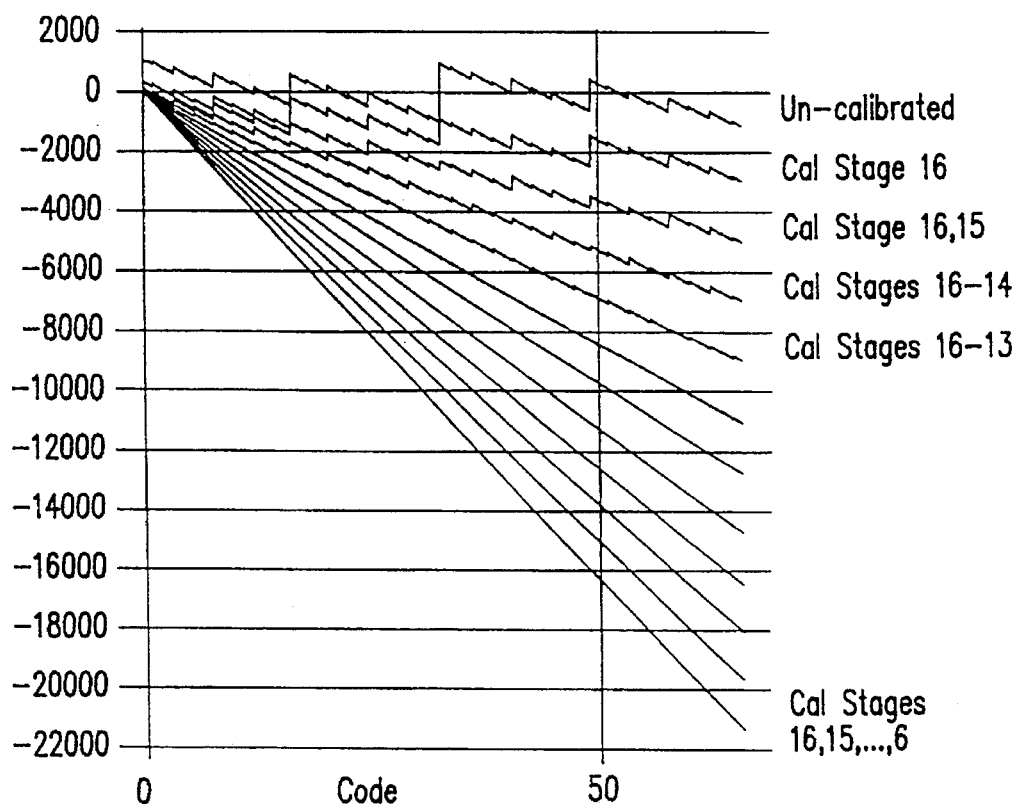
FIG. 7 is a set of graphs depicting improving linearity with increasing number of stages calibrated.
Figure 10A:
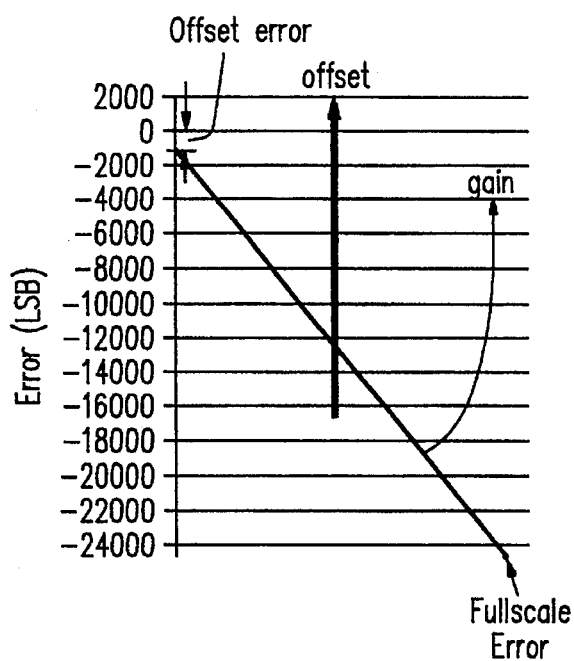
FIG. 10a is a graph depicting linearity error after calibrating out single stage gain and charge injection errors.

Calibration of stages 10-6 through 10-16 using prior techniques, such as explained above, leads to large gain and offset errors. For interstage gain of 1.97, the gain error is in excess of 20,000 LSB (see FIG. 7). By way of example, the integral non-linearity is calculated using a 16-bit pipelined ADC with 10 ppm/volt second order capacitor voltage coefficient. As is known, by using a differential signal path, first order capacitor voltage coefficient is cancelled. FIG. 10a shows the linearity error after calibrating out the single-stage gain and charge injection errors. This is the resulting linearity of prior art ADC circuits after the calculation of $K_0$, $K_1$ and $K_2$ for stages 10-6 through 10-16 prior to the curve-fit calibration of the present invention.

Figure 9:
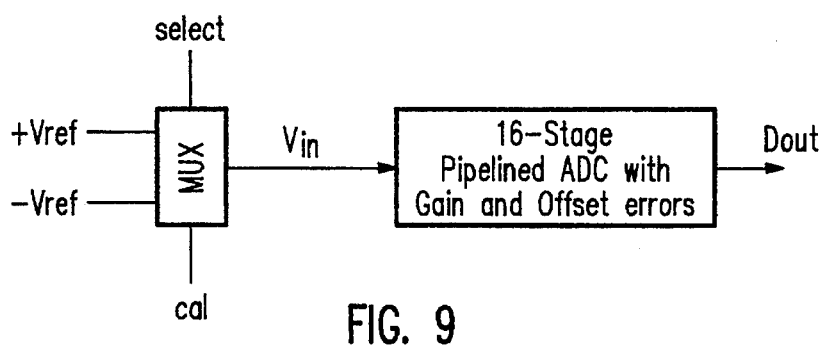
FIG. 9 is a block diagram depicting an analog to digital converter and circuitry for applying ±Vref to its input for calibration in accordance with this invention.

Applying +Vref and −Vref as the input signal Vin to the pipelined ADC as shown in FIG. 9, the ADC offset and ADC gain errors are determined. Digital correction terms are generated by applying +Vref to the ADC to measure the ADC fullscale error and by applying -Vref to measure the ADC offset error. The first correction term, gain, given by $$\text{gain} = \frac{\text{fullscale error} - \text{offset error}}{2^N} \quad (10)$$

allows adjustment of the slope of the linearity, for example by using a multiplier. Note that the denominator in equation (10) is equal to 65536 ($2^{16}$), the number of possible output codes from the ADC when the ADC contains 16 stages, by way of example. The second correction term, offset, allows for adjustment of the offset of the linearity, for example by using an adder. For each normal conversion cycle, the raw digital output Dout(raw) is modified using gain and offset correction factors, as shown by Equations 11 and 12.

$$Dout_1 = Dout(raw) - offset \quad (11)$$

and, following this step, $$Dout(g/o\ corrected) = Dout_1 - Dout_1 \times gain \quad (12)$$

where Dout(g/o corrected) is a digital output word including correction for gain and offset errors.

Figure 10B:
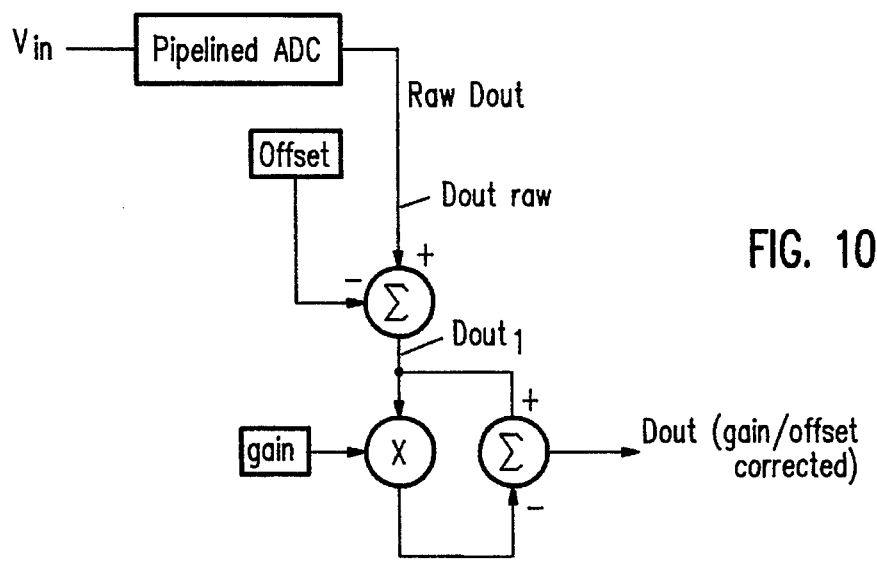
FIG. 10b is a block diagram depicting an analog to digital converter together with digital correction stages, in accordance with this invention.
Figure 11:
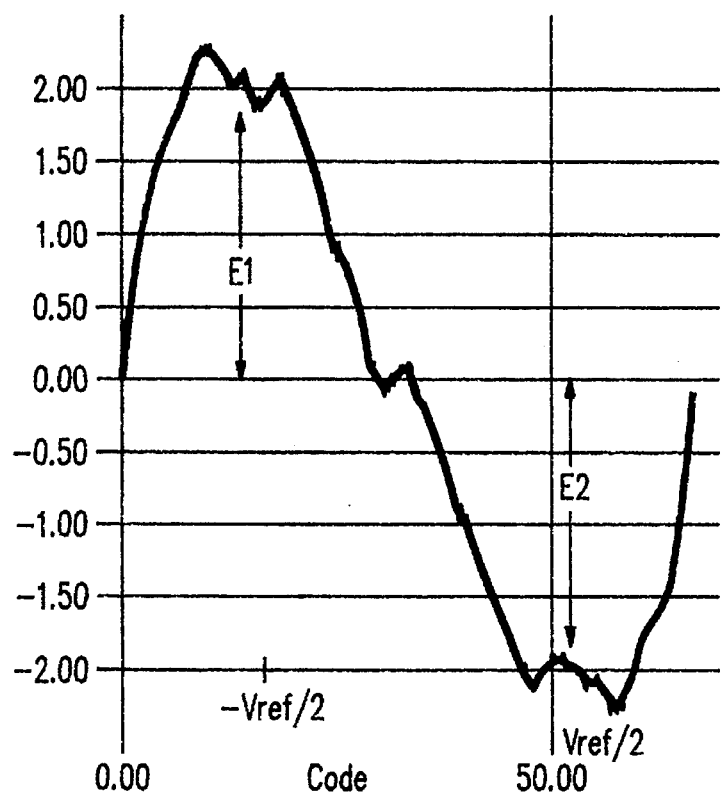
FIG. 11 is a graph depicting the resulting linearity error for an exemplary analog to digital converter including digital correction in accordance with this invention.

Once the offset and gain are calibrated, the linearity error is, for an exemplary 16 bit ADC, on the order of 2LSB (14 bits accurate), as shown in FIG. 11. FIG. 10b is a block diagram of a structure in accordance with the teachings of this invention suitable for implementing the correction factors exemplified by equations (11) and (12).

FIG. 9 depicts how MSB stage 10-1 is calibrated in accordance with the teachings of this invention for removing the "system gain" and "system offset" errors.

Measurement of Second Order Coefficient

Assuming stages 10-2 through 10-N were previously calibrated, for example by using techniques known in the prior art as well as the offset and gain calibration of this invention as described above, they may be used to measure the linearity of the first stage, stage 10-1 and the ADC gain error and ADC offset error. A capacitor voltage coefficient error on the first stage results in a hyperbolic type transfer function in the linearity plot. This hyperbola has its vertices at ±Vref/2 which, for a typical ADC operating with a Vcc of 5 volts, and thus using a Vref of 5 volts, this hyperbola has its vertices at approximately plus and minus 2.5 volts, as shown in FIG. 11.

Ideally, (no voltage coefficient) the digital output words are equal to:

$$Dout = 16384\ for\ Vin = -2.5v \quad (13)$$

$$Dout = 49152\ for\ Vin = +2.5v \quad (14)$$

However, when an inherent and undesirable error of, for example, a 10 ppm of capacitors second order voltage coefficient in the first stage 10-1, Dout is changed:

$$Dout = 16384 + E_1\ for\ Vin + \frac{-Vref}{2} \quad (15)$$

$$Dout = 49152 - E_2\ for\ Vin + \frac{+Vref}{2} \quad (16)$$

where $E_1$ and $E_2$ are digital values representing the error introduced by the 10 ppm voltage coefficient in the first stage for Vin=-Vref/2 and Vin=+Vref/2, respectively.

By applying exactly ±Vref/2 to the input of the first stage 10-1 after calibration of stages 10-2 through 10-N (see FIG. 12), the values of $E_1$ and $E_2$ are determined. As an example, for a capacitor voltage coefficient of 10 ppm, this results in $$E_1 = 2.1\ LSB \quad (17)$$

$$E_2 = 2.1\ LSB \quad (18)$$

Figure 13:
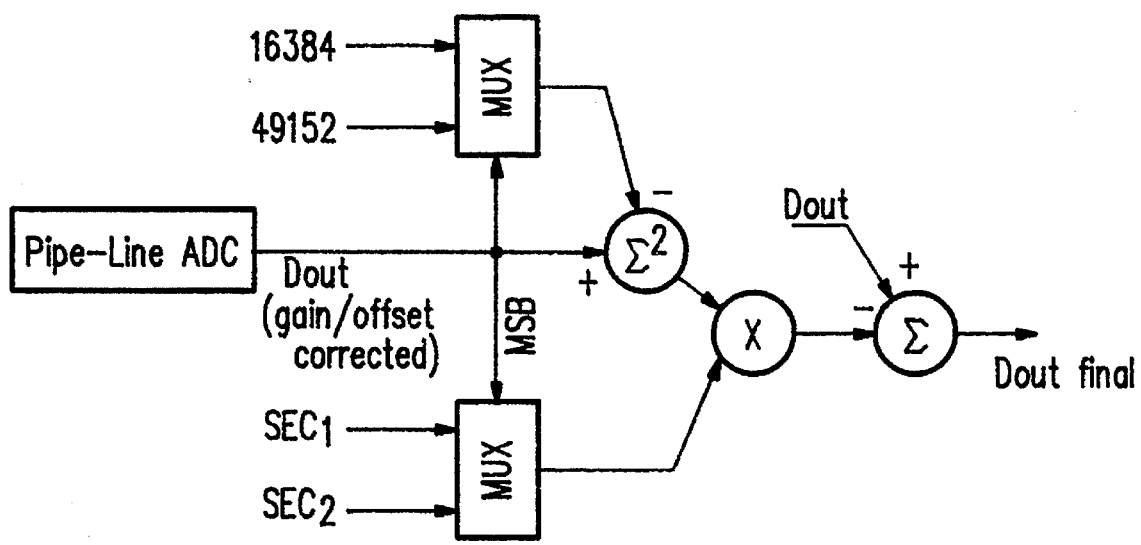
FIG. 13 is a block diagram depicting an analog to digital converter including digital correction features as taught by the present invention.

Once $E_1$ and $E_2$ have been determined, generated coefficients allow the adjustment of the gain/offset corrected digital output word to provide the final digital output word Dout(final), as depicted in FIG. 13.

The second order correction coefficients are defined as:

$$SEC_1 = \frac{E_1}{(output:-Vref/2)^2} \quad (19)$$

$$SEC_2 = \frac{E_2}{(output:+Vref/2 - \text{sign bit})^2} \quad (20)$$

where output:-Vref/2 is equal to the digital output word for an ideal situation (i.e. without any error) when the ADC receives an input voltage of -Vref/2. In the example where N=16 and Vref=5 volts, this value output:-Vref/2 is equal to 16384. Similarly, output:+Vref/2-sign bit is equal to the digital output word for an ideal situation when the ADC receives an input voltage of +Vref/2, minus the digital value of the sign bit. In the example in which N=16 and Vref=5 volts, output:+Vref/2 is equal to 49152 and the digital value of the sign bit is equal to 32768, and thus the value of output:+Vref/2-sign bit is equal to 16384.

This results in the following operations on the gain/offset corrected version of Dout (Dout(g/o corrected) from the operation of equations (11) and (12), for example by the exemplary circuitry of FIG. 10b) to provide a final value Dout(final):

if sign bit=1, then
$$Dout(\text{final}) = Dout(g/o\ \text{corrected}) + (SEC_2)(Dout(g/o\ \text{corrected}) - 49152)^2 \quad (21)$$

if sign bit=0, then
$$Dout(\text{final}) = Dout(g/o\ \text{corrected}) + (SEC_1)(Dout(g/o\ \text{corrected}) - 16384)^2 \quad (22)$$

Figure 14:
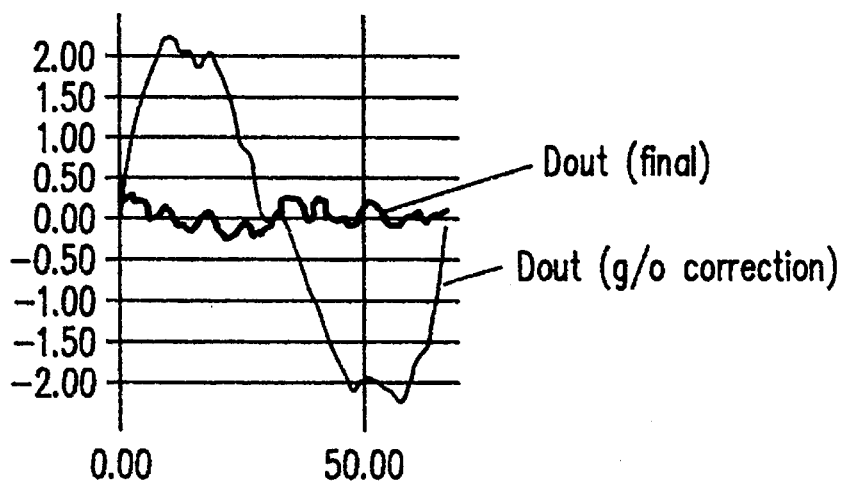
FIG. 14 is a graph depicting the improvement in analog to digital converter accuracy as a result of the second order calibration feature of the present invention.

FIG. 14 is a graph depicting a first curve Dout(g/o correction) showing a rather significant second order voltage coefficient existing after gain and offset calibration as taught by the present invention, but prior to second order calibration. The second curve Dout(final) of FIG. 14 shows the much improved second order voltage coefficient resulting from second order calibration in accordance with the teachings of this invention. Second order calibration, with linear gain and offset calibration, improves the total unadjusted error to ¼ LSB accuracy with no offset or fullscale error.

Thus in accordance with the teachings of this invention several digital correction techniques are taught for improving the accuracy of pipelined analog to digital converters, by determining the nature of the inherent inaccuracies of the analog to digital converter and manipulating the raw digital result from the ADC to provide a digitally corrected highly accurate output word. While the examples given above show digital correction being performed using dedicated digital adders and multipliers, it will be appreciated by those of ordinary skill in the art in light of the teachings of this invention that other types of digital manipulation, such as with microprocessors or table look up features, can be used without departing from the spirit of this invention.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A pipelined analog to digital converter system comprising:
    a pipelined analog to digital converter circuit for receiving an analog input signal and providing a raw digital output word representing said analog input signal, said raw digital output word including a system gain error and a system offset error; and
    digital circuitry for receiving said raw digital output word and providing a final digital output word representative of said analog input signal, said digital circuitry modifying said raw digital output word to adjust for said system gain error and said system offset error inherent in said pipelined analog to digital converter circuit.

2. A pipelined analog to digital converter system as in claim 1 which further comprises a circuit to apply a first reference voltage as said analog input signal to obtain a digital output word indicative of said offset error and a second reference voltage as said analog input signal to obtain a digital output word indicative of said system gain error.

3. A pipelined analog to digital converter system as in claim 2 wherein said second reference voltage is the same magnitude and opposite sign as said first reference voltage.

4. A pipelined analog to digital converter system as in claim 2 wherein said digital circuitry comprises a summer for adjusting said raw digital output word to correct for said system offset error.

5. A pipelined analog to digital converter system as in claim 2 wherein said digital circuitry comprises a multiplier for adjusting said raw digital output word to correct for said gain error.

6. A pipelined analog to digital converter system as in claim 2 wherein said digital circuitry comprises a processor for adjusting said raw digital output word to correct for said offset error.

7. A pipelined analog to digital converter system as in claim 2 wherein said digital circuitry comprises a processor for adjusting said raw digital output word to correct for said gain error.

8. A pipelined analog to digital converter system as in claim 1 which further comprises circuitry for calibrating one or more LSB stages of said analog to digital converter circuit prior to determining said gain and offset errors.

9. A pipelined analog to digital converter system as in claim 2 wherein said analog to digital converter circuit uses reference voltages of ±Vref, and said first and second reference voltages are ±Vref.

10. A pipelined analog to digital converter system as in claim 2 which further comprises circuitry for applying third and fourth reference voltages as said analog input signal to obtain digital words indicative of second order errors.

11. A pipelined analog to digital converter system as in claim 10 wherein said fourth reference voltage is the same magnitude and opposite sign as said third reference voltage.

12. A pipelined analog to digital converter system as in claim 10 wherein said digital circuitry comprises a summer for adjusting said raw digital output word to correct for said second order errors.

13. A pipelined analog to digital converter system as in claim 10 wherein said digital circuitry comprises a processor for adjusting said raw digital output word to correct for said second order errors.

14. A pipelined analog to digital converter system as in claim 10 wherein said analog to digital converter circuit uses reference voltages of ±Vref, and said third and fourth reference voltages are ±Vref/2.

15. A method for calibrating a pipelined analog to digital converter system comprising the steps of:
    calibrating a plurality of LSB stages;
    applying a first reference signal to a pipelined analog to digital converter to obtain a first digital output word indicative of the system offset error of one or more uncalibrated MSB stages;
    determining an offset error correction term by comparing said first digital output word with an expected digital value associated with said first reference signal;
    storing said offset error correction term;
    applying a second reference signal to said analog to digital converter to obtain a second digital output word indicative of the system gain error of said one or more uncalibrated MSB stages;
    determining a gain error correction term by differencing said first digital output word and said second digital output word and dividing by the total possible digital counts associated with said pipelined analog to digital converter;
    storing said gain error correction term;
    applying an analog input signal to said pipelined analog to digital converter .said pipelined analog to digital converter responsive to said analog input signal yielding a raw digital output signal;
    summing said raw digital output signal and said offset error correction term to yield an offset corrected digital signal;
    multiplying said offset corrected digital signal with said gain error correction term to yield a gain corrected digital signal; and
    differencing said gain corrected digital signal from said offset corrected digital signal to produce a gain and offset adjusted digital signal.

16. A method as in claim 15 wherein said analog to digital converter system used as reference voltages ±Vref, and said first an second reference signals are ±Vref.

17. A method as in claim 15 which further comprises the steps of:
    applying third and fourth reference voltages to said analog to digital converter system to determine a second order error coefficient.

18. A method as in claim 17 wherein said third and fourth voltages are equal to ±Vref/2.

19. A method for operating a pipelined analog to digital converter system comprising the steps of:
    calibrating a plurality of LSB stages;
    applying a first reference signal to a pipelined analog to digital converter to obtain a first digital output word indicative of the offset error of one or more uncalibrated MSB stages;
    applying a second reference signal to said pipelined analog to digital converter to obtain a second digital output word indicative of the gain error of said one or more uncalibrated MSB stages;
    applying an unknown analog input signal to said analog to digital converter to obtain a raw digital output word indicative of said analog input signal; and modifying said raw digital output word utilizing said first digital output word in order to provide a final digital output word which more accurately represents said analog input signal.

20. A method as in claim 19 wherein said pipelined analog to digital converter system used as reference voltages ±Vref, and said first an second reference signals are ±Vref.

21. A method as in claim 19 which further comprises the steps of:

applying third and fourth reference voltages to said pipelined analog to digital converter system to determine a second order error coefficient.

22. A method as in claim 21 wherein said third and fourth voltages are equal to ±Vref/2.

23. A method as in claim 17 which further comprises a step of modifying said raw digital output word in response to said second order error coefficient to provide said final digital output word.

24. An pipelined analog to digital converter system comprising:

a pipelined analog to digital converter circuit including an analog input for receiving an analog input signal and a digital output for providing a raw digital output word representing said analog input signal, said raw digital output word including a system gain error and a system offset error;

a calibration circuit including a switching element for switching a first and second reference signal to said analog input and a storage element, said pipelined analog to digital converter circuit producing a fullscale error signal in response to said first reference signal, and an offset error signal in response to said second reference signal; and digital circuitry for receiving said fullscale error signal, said offset error signal and said raw digital output word and providing an adjusted digital output word representative of said analog input signal and adjusted for said system gain and system offset error inherent in said pipelined analog to digital converter circuit, said digital circuitry being responsive to said offset error signal and storing an offset correction term in said storage element, said digital circuitry being responsive to said fullscale error signal and storing a gain correction term in said storage element, said adjusted digital output word defined as $$Dout_{g/o} = (Dout_{raw} - \text{offset}) - (\text{gain} \times (Dout_{raw} - \text{offset})),$$

where $Dout_{g/o}$ is the adjusted digital output word, $Dout_{raw}$ is the raw digital output word, offset is the offset correction term, and gain is the gain correction term.

25. The pipelined analog to digital converter system as in claim 24 wherein said offset correction term is defined as the difference of the offset error signal and an expected digital output signal associated with said second reference signal.

26. The pipelined analog to digital converter system as in claim 24 wherein said gain correction term is defined as the difference of said fullscale error signal and said offset error signal divided by the maximum number of possible output codes generated by said pipelined analog to digital convertor circuitry.

27. The pipelined analog to digital converter system as in claim 24 wherein said first and second reference signals are of equal magnitude and opposite sign.

28. The pipelined analog to digital converter system as in claim 24 further comprising:

voltage coefficient error correction circuitry responsive to said adjusted digital output word for providing a final digital output word adjusted for capacitor voltage coefficient error inherent in said pipelined analog to digital circuitry;

said calibration circuitry switching element for switching a third and fourth reference signal to said analog input, said pipelined analog to digital converter circuit producing a first capacitance error signal in response to said third reference signal, and a second capacitance error signal in response to said fourth reference signal; and, said voltage coefficient error correction circuitry being responsive to said first capacitance error signal and storing an first capacitance correction term in said storage element, said voltage coefficient error correction circuitry being responsive to said second capacitance error signal and storing a second capacitance correction term in said storage element, said final digital output word defined as $$Dout_{final} = Dout_{g/o} + (\sec_2 \times (Dout_{g/o} - D_{vref/2})^2), \text{ if } Dout_{g/o} > 0,$$

and $$Dout_{g/o} + (\sec_1 \times (Dout_{g/o} - D_{-vref/2})^2), \text{ if } Dout_{g/o} < 0,$$

where $Dout_{g/o}$ is said adjusted digital output word, $D_{-vref/2}$ is an expected digital output associated with said third reference signal, $D_{vref/2}$ is an expected digital output associated with said fourth reference signal, $\sec_1$ is said first capacitance correction term, and $\sec_2$ is said second capacitance correction term.

29. The pipelined analog to digital converter system as in claim 28 wherein said first capacitance correction term is defined as the difference of said first capacitance error signal and an second expected output signal associated with said third reference signal.

30. The pipelined analog to digital converter system as in claim 28 wherein said second capacitance correction term is defined as the difference of said second capacitance error signal and a third expected output signal associated with said fourth reference signal.

31. The pipelined analog to digital converter system as in claim 28 wherein said third and fourth reference signals are one half of the value of said first and second reference signals respectively.

32. The method as in claim 15 further comprising the steps of:

applying a third reference signal to said pipelined analog to digital converter to obtain a third digital output word indicative of the first capacitance error of one or more uncalibrated MSB stages;

determining an first capacitance error correction term by comparing said third digital output word with a second expected digital value associated with said third reference signal;

storing said first capacitance error correction term;

applying a fourth reference signal to said analog to digital converter to obtain a fourth digital output word indicative of the second capacitance error of said one or more uncalibrated MSB stages;

determining an second capacitance error correction term by differencing said fourth digital output word and a third expected digital value associated with said fourth reference signal;

storing said second capacitance error correction term; and modifying said offset and gain adjusted digital signal according to the formula $$Dout_{final} = Dout_{g/o} + (sec_2 \times (Dout_{g/o} - D_{vref/2})^2), \text{ if } Dout_{g/o} > 0,$$

and $$Dout_{g/o} + (sec_1 \times (Dout_{g/o} - D_{-vref/2})^2), \text{ if } Dout_{g/o} < 0,$$

where $Dout_{final}$ is said final digital output word, $Dout_{g/o}$ is said offset and gain adjusted digital output word, $D_{-vref/2}$ is an expected digital output associated with said third reference signal, $D_{vref/2}$ is an expected digital output associated with said fourth reference signal, $sec_1$ is said first capacitance correction term, and $sec_2$ is said second capacitance correction term.

* * * * *